United States Patent [19]

Murray

[11] 4,160,980

[45] Jul. 10, 1979

[54] DIPOLE ANTENNA WITH PARABOLIC REFLECTOR

[76] Inventor: James G. Murray, P.O. Box 442, White Rock, S.C. 29177

[21] Appl. No.: 840,729

[22] Filed: Oct. 11, 1977

[51] Int. Cl.$^2$ .................. H01L 21/26

[52] U.S. Cl. .................. 343/795; 343/818; 343/840

[58] Field of Search .................. 343/840, 795, 818, 819, 343/794, 793, 815, 836, 834, 835

[56] References Cited

U.S. PATENT DOCUMENTS

| | | | |
|---|---|---|---|
| 2,714,659 | 8/1955 | Johnson et al. | 343/795 |
| 3,982,248 | 9/1976 | Archer | 343/840 |

*Primary Examiner*—David K. Moore

*Attorney, Agent, or Firm*—B. P. Fishburne, Jr.

[57] ABSTRACT

A UHF antenna for black and white and color television receivers embodies a dished reflector and coacting a dipole mounted a fraction of a wave-length in front of the reflector and being of bow tie configuration. The antenna possesses broad band characteristics for wide angle reception, and wide frequency deviation at UHF wave-lengths. The antenna structure which is for indoor use is fabricated from simple sheet metal components and embodies an integral support base which can be manually adjusted in any direction. Economy and simplicity of construction are featured.

3 Claims, 5 Drawing Figures

FIG. 3
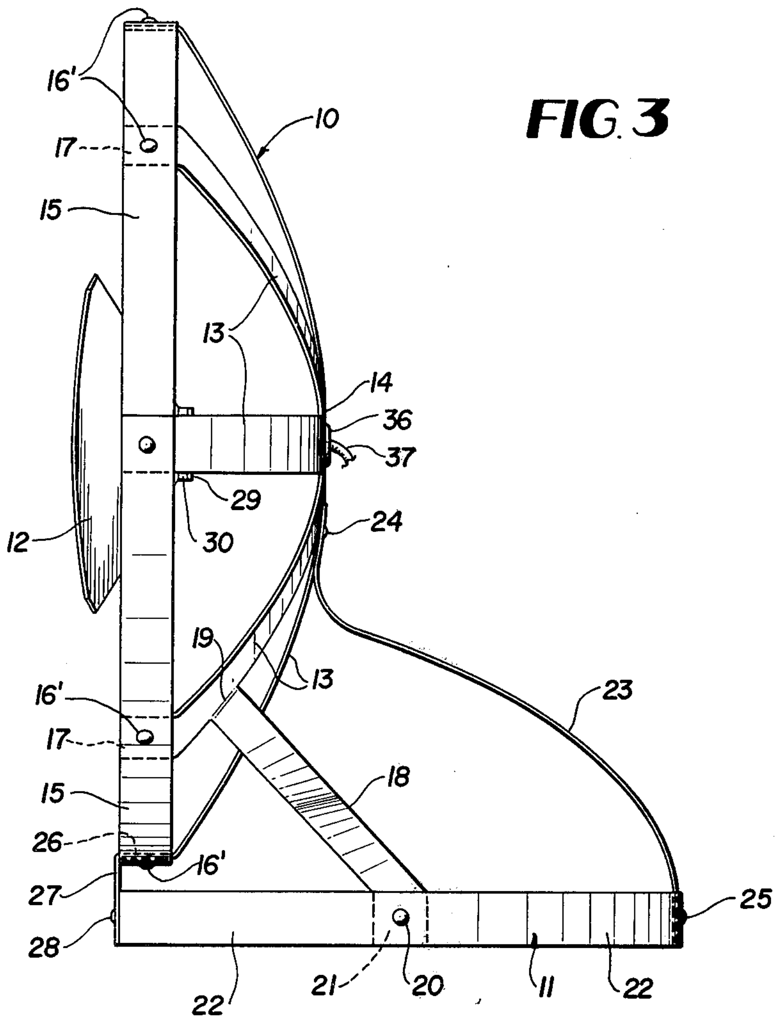
FIG. 4
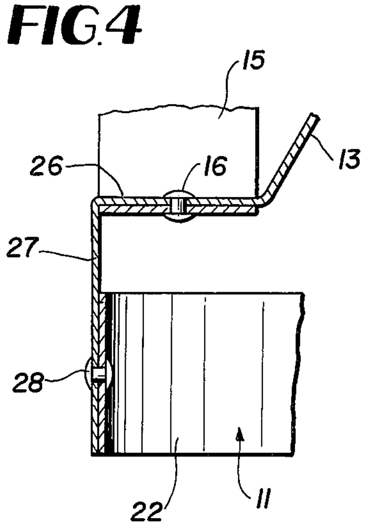
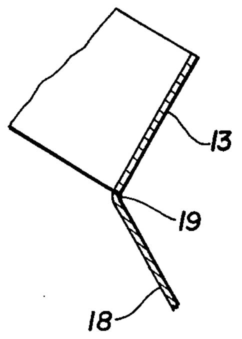
FIG. 5

DIPOLE ANTENNA WITH PARABOLIC REFLECTOR

BACKGROUND OF THE INVENTION

A persistent need for more efficient, less complicated, less costly and more compact indoor television antennas exists in the art, and the general objective of the present invention is to satisfy this need by improving on the known prior art.

Some examples of the known prior art are contained in U.S. Pat. Nos. 2,366,423 and 2,724,659.

The present invention combines efficiency of operation and simplicity and economy of mechanical construction and also compactness in an indoor UHF antenna which performs particularly well on color television receivers while also exhibiting good performance with black and white receivers.

SUMMARY OF THE INVENTION

A UHF television antenna of unitary construction is formed essentially from a few sheet metal components which can be economically manufactured and assembled to produce a compact antenna structure. The antenna structure includes a horizontal ring base, which is freely adjustable in any direction, and rising struts or braces which support a horizontal axis dished reflector and a forwardly spaced dipole of approximate bow tie configuration. A simple spacer sleeve projecting forwardly from the center of the reflector carries an insulating mounting element with the dipoles at its forward end and the antenna cable, whose conductors are electrically connected with the dipole, is received rearwardly through the spacer sleeve so that it may extend rearwardly of the dished reflector for connection with the UHF antenna terminals of any television receiver.

BRIEF DESCRIPTION OF THE DRAWINGS

FIG. 3 is a side elevation of the antenna.

FIG. 4 is an enlarged fragmentary vertical section taken on line 4—4 of FIG. 1.

FIG. 5 is a similar section taken on line 5—5 of FIG. 1.

DETAILED DESCRIPTION

Figure 1:
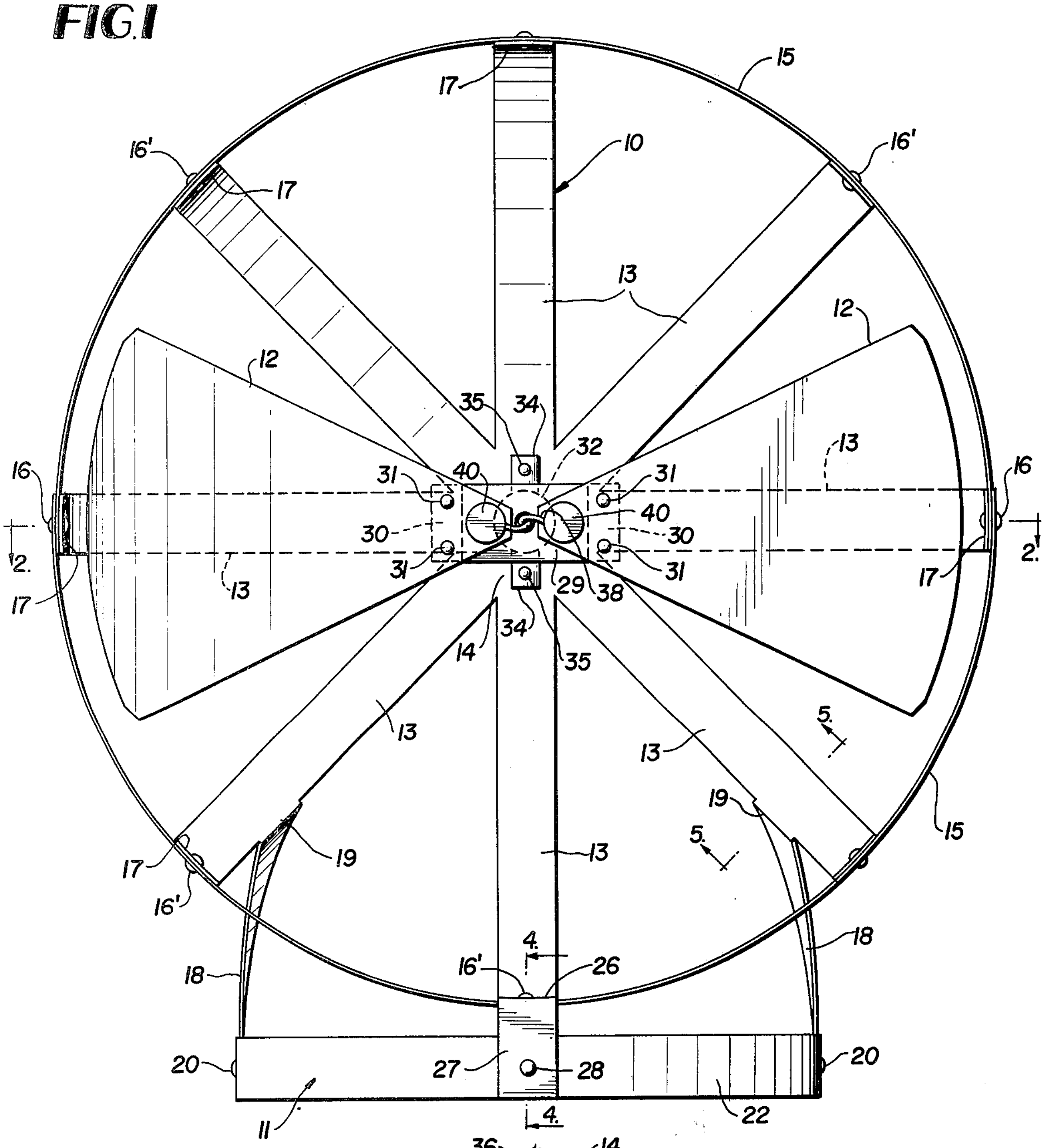
FIG. 1 is a front elevation of a television antenna embodying the invention.

Referring to the drawings in detail wherein like numerals designate like parts, a UHF television antenna for indoor usage is shown and the antenna is constructed essentially from sheet metal which possesses good electrical characteristics, such as aluminum.

The antenna comprises a horizontal axis dished reflector 10, a horizontal support base 11, and a bow tie dipole 12 supported a fraction of a wavelength forwardly of the reflector 10 by means to be described.

The dished reflector 10 comprises a preferably parabolically curved body portion having a plurality of circumferentially spaced radial arms or spokes 13, all of which are integrally joined at the center of the reflector 10 to form a comparatively small central solid area 14. The spoked reflector body can economically be produced as a unitary sheet metal stamping.

The reflector 10 additionally comprises a circular horizontal axis rim preferably formed from a pair of semicircular rim sections 15 but in some cases formed from a single unitary metal strip. The ends of rim sections 15 are riveted at 16 to short forward extensions 17 of one diametrical pair of spokes 13, as illustrated. The other spokes 13 also carry the same forward extensions 17 which are similarly riveted at 16' to the two rim sections 15. In this manner, the reflector 10 is unitized and is rendered quite stiff structurally and therefore durable.

The dished reflector 10 is connected with and supported on the horizontal base 11 by a pair of laterally spaced inclined braces 18 integrally joined at their tops 19 to one pair of the spokes 13, and having their lower ends riveted as at 20 to the overlapping ends 21 of a pair of semi-circular base strips or sections 22 which form the circular horizontal base 11. In some cases, the base 11 can be formed, if desired, from a single metal strip formed into a circular band instead of two connected semi-circular strips. The reflector 10 is further supported and stabilized on the base 11 by a rear curved and inclined brace 23 whose upper end is riveted at 24 to the back of one of the reflector spokes 13 near the center of the reflector and whose lower end portion is riveted at 25 to the base 11, FIG. 3.

As shown particularly in FIG. 4, the lower center vertical spoke 13 carries a horizontal extension 26 riveted at 16' to the adjacent rim section 15 and an integral depending vertical extension 27 connected by a rivet 28 to the forward base section 22. The described arrangement renders the antenna quite rigid and durable and also sturdy. The construction is compact and lightweight and essentially unitary. The entire antenna can be adjusted in any direction horizontally and can be rotated on the vertical axis of the base 11 and can also be raised and lowered to assure the best possible orientation relative to the broadcast signal and the best possible reception by the receiver in terms of picture and sound.

The previously-mentioned bow tie dipole 12 have its narrow end portions disposed radially innermost and its wide ends outermost, near and slightly inwardly of the reflector rim, as viewed in FIG. 1, and slightly forwardly of this rim as viewed in FIG. 3. The dipole 12 is also curved longitudinally in approximate parallelism to the curvature of the reflector 10, FIG. 2.

The dipole 12 is firmly supported in fixed relationship to the reflector 10 so as to span the reflector diametrically in a horizontal direction by a terminal plate 29 of electrical insulating material disposed in a vertical plane. This plate on its forward side carries two insulating blocks 30 which are riveted at 31 to inner end portions of the dipole 12. A horizontal axis metal spacer sleeve 32 has forward lateral lugs connected by rivets 33 to the insulating plate 29 and has rear lugs 34, FIG. 1, connected by rivets 35 to the center solid portion 14 of the dished reflector 10, a rubber grommet 36 being placed in a center aperture formed in the reflector portion 14 in alignment with the spacer sleeve 32. The spacer sleeve 32 is thus rigidly supported on the center portion 14 of the dished reflector and extends forwardly horizontally to firmly support the dipole 12 and insulate it from the reflector through the terminal blocks 30 and insulating plate 29.

Figure 2:
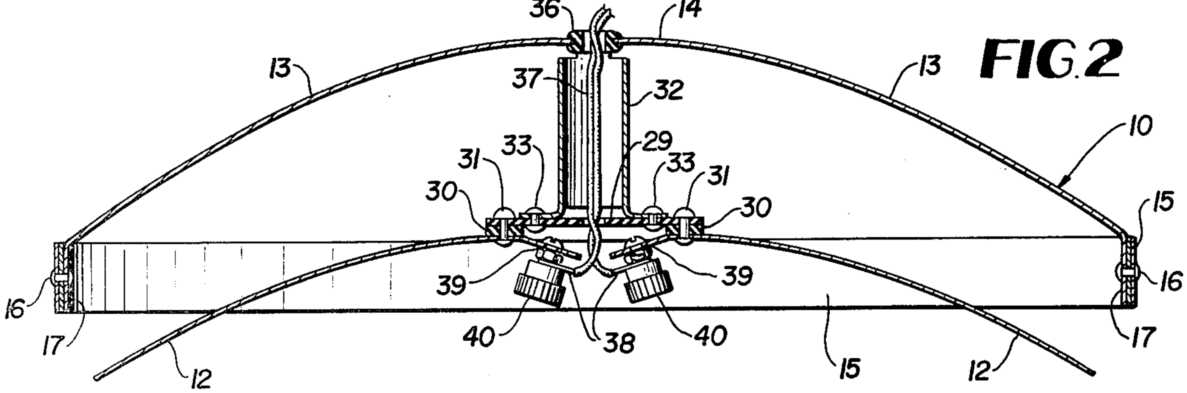
FIG. 2 is a horizontal section taken on line 2—2 of FIG. 1.

The antenna transmission cable 37 has its two conductors 38, FIG. 2, electrically connected to terminal screws 39 of the dipole 12 and secured by nuts 40 or the like. The cable 37 passes rearwardly through the spacer sleeve 32 and grommet 36, as shown, and leads to and is connected with the UHF antenna terminals of a television receiver, not shown.

The advantages of the antenna should now be readily apparent from the foregoing description and need not be repeated. The antenna is economical, lightweight, compact and easily adjustable. Its performance with color or black and white receivers is excellent and its mechanical construction is very simple and essentially unitary for the convenience of the user.

It is to be understood that the form of the invention herewith shown and described is to be taken as a preferred example of the same, and that various changes in the shape, size and arrangement of parts may be resorted to, without departing from the spirit of the invention or scope of the subjoined claims.

I claim:

1. A unitized substantially all sheet metal television antenna comprising a substantially parabolically curved horizontal axis frontally open dished reflector, said reflector having a body formed by a plurality of circumferentially equidistantly spaced radial arms integrally joined near the axial center of the reflector and being formed of substantially equal width strips of sheet metal, the zones between said arms being open and unobstructed, an axial annular rim formed of sheet metal joined to the outer ends of the radial arms and forming therewith an integrated reflector structure, the sheet metal rim being formed of a strip having substantially the thickness and width of said radial arms, said rim being coaxial with said reflector axis, a bow tie dipole spaced forwardly of the parabolically curved body of the reflector and spanning the major portion of the diameter of the reflector and being curved longitudinally in general parallelism to the body of the reflector, an axial spacer sleeve anchored to the center portion of the reflector body and projecting forwardly thereof, an insulating plate secured to the forward end of the spacer sleeve, said bow tie dipole being attached to and supported by the insulating plate, an electrical cable having terminals electrically connected to said dipole, said cable extending rearwardly through said spacer sleeve and beyond the rear of said dished reflector for connection with antenna terminals of a television receiver, a supporting base for the antenna including a vertical axis ring formed of sheet metal of substantially the same width and thickness employed for said rim and arms and being positioned somewhat below the bottom of said rim, and plural braces formed of sheet metal having substantially the same thickness and width as the sheet metal forming said ring and interconnecting said ring at plural circumferentially spaced points thereon with a corresponding number of spaced points on the body of said reflector.

2. A unitized substantially all sheet metal television antenna as defined in claim 1, and said braces being three in number and one brace extending from the rear of said ring upwardly to the rear of the reflector body near the center of the reflector body, and a pair of said braces extending upwardly from diametrically opposite sides of the ring to a pair of said arms of the reflector body which are immediately on opposite sides of the bottom center arm of the reflector body.

3. A unitized substantially all sheet metal television antenna as defined in claim 2, and said last-named pair of braces comprising integral extensions of said last-named reflector body arms, all of said braces being forwardly inclined relative to said ring.

* * * * *